United States Patent [19]

Mimura

[11] E Patent Number: Re. 33,584

[45] Reissued Date of Patent: May 7, 1991

[54] HIGH ELECTRON MOBILITY SINGLE HETEROJUNCTION SEMICONDUCTOR DEVICES

[75] Inventor: Takashi Mimura, Machida, Japan

[73] Assignee: Fujitsu Limited, Kawasaki, Japan

[21] Appl. No.: 869,669

[22] Filed: Jun. 2, 1986

Related U.S. Patent Documents

Reissue of:

[64] Patent No.: 4,424,525
Issued: Jan. 3, 1984
Appl. No.: 220,968
Filed: Dec. 29, 1980

[30] Foreign Application Priority Data

| | | | |
|---|---|---|---|
| Dec. 29, 1979 | [JP] | Japan | 54-171026 |
| Dec. 29, 1979 | [JP] | Japan | 54-171027 |
| Jun. 17, 1980 | [JP] | Japan | 55-82035 |
| Jun. 27, 1980 | [JP] | Japan | 55-87527 |

[51] Int. Cl.[5] ..... H01L 29/80; H01L 29/78

[52] U.S. Cl. ..... 357/22; 357/23.2; 357/4; 357/15; 357/16; 357/24; 357/55; 357/56

[58] Field of Search ..... 357/22 A, 23.2, 4, 15, 357/16, 24, 55, 56

[56] References Cited

U.S. PATENT DOCUMENTS

| | | | |
|---|---|---|---|
| 3,263,095 | 7/1966 | Fang | 307/304 |
| 3,767,984 | 10/1973 | Shinoda et al. | 357/16 |
| 4,021,833 | 5/1977 | Curnee | 357/15 |
| 4,075,652 | 2/1978 | Umebachi et al. | 357/22 |
| 4,157,556 | 6/1979 | Decker et al. | 357/22 |
| 4,173,764 | 11/1979 | Cremoux | 357/22 |
| 4,194,935 | 3/1980 | Dingle et al. | 437/107 |
| 4,471,360 | 9/1984 | Delagebeaudeuf et al. | 357/16 |

FOREIGN PATENT DOCUMENTS

| | | |
|---|---|---|
| 0005059 | 10/1979 | European Pat. Off. . |
| 53-126282 | 11/1978 | Japan . |
| 2012480 | 7/1979 | United Kingdom . |

OTHER PUBLICATIONS

Zeidenbergs et al., "A Proposed Heterojunction Field--Effect Transistor", IEEE, vol. 54, No. 12, p. 1960, Dec., 1966.

Dingle, R., et al., "Electron Mobilities in Modulation-Doped Semiconductor Heterojunction Superlattices", Appl. Phys. Lett., Oct. 1, 1978, pp. 665-667.

Stormer, E. L., et al., "Two-Dimensional Electron Gas at a Semiconductor-Semiconductor Interface", Sol. St. Comm., vol. 29, Mar. 1979, pp. 705-709.

Tsui, D. C., et al., "Observation of Two-Dimensional Electrons in LPE-Grown GaAs $Al_xGa_{1-x}As$ Heterojunctions", Appl. Phys. Lett., Jul. 15, 1979, pp. 99-101.

Abstreiter, G., et al., "Inelastic Light Scattering from a Quasi-Two-Dimensional Electron System in GaAs-$Al_xGa_{1-x}As$ Heterojunctions", Phys. Rev. Lett., May 7, 1979, pp. 1308-1311.

Dingle, R., et al., "Electronic Properties of the GaAs-AlGaAs Interface with Applications to Multi-Interface Heterojunction Superlattices", Yamada Conference, Sep. 1979, pp. 30-43.

Plook, K., "Anreicherung von Ladungstragern an der Grenzflache zweier Halbleiter mit unter schiedlichem Bandabstand", *Electronik Industrie, Oct. 1979, pp. 13-14.*

Best, J. S., "The Schottky-Barrier Height of Au on n-$Ga_{1-x}Al_xAs$ as a Function of AlAs Content", Appl. Phys. Lett., Apr. 4, 1979, pp. 522-524.

Sze, S. M. *Physical of Semiconductor Devices*, pp. 370-371, 444-445, and 462-465 (1969).

*Primary Examiner*—Andrew J. James
*Assistant Examiner*—Sara W. Crane
*Attorney, Agent, or Firm*—Staas & Halsey

[57] ABSTRACT

A thin electron accumulation layer is generated along a heterojunction between two kinds of semiconductors each of which has a different electron affinity. This electron accumulation layer suffers less ionized-impurity scattering, because the thickness does not exceed the spread of an electron wave. A channel constituted with this electron accumulation enjoys an excellent electron mobility, particularly at cryogenic temperatures. A layer configuration fabricated with two different semiconductors having different electron mobilities and a similar crystal lattice coefficient, and including a single heterojunction, is effective to improve electron mobility. Such a layer configuration can be employed for production of an active semiconductor device with high electron mobility, resulting in high switching speed. The semiconductor devices including a FET, a CCD, etc., exhibit an excellent transfer conductance Gm.

40 Claims, 10 Drawing Sheets

HIGH ELECTRON MOBILITY SINGLE HETEROJUNCTION SEMICONDUCTOR DEVICES

Matter enclosed in heavy brackets [ ] appears in the original patent but forms no part of this reissue specification; matter printed in italics indicates the additions made by reissue.

BACKGROUND OF THE INVENTION

This invention relates to semiconductor devices with high electron mobility, more particularly to FETs utilizing electrons accumulated in the neighborhood of a single heterojunction due to the difference in electron affinity between the two different kinds of semiconductors which form a single heterojunction. More specifically, this invention relates to active semiconductor devices each of which has a single heterojunction formed between a pair of layers fabricated with two different semiconductors having different electron affinities from each other and which employs a field effect caused by one or more gates for regulation of the concentration of electrons accumulated along the single heterojunction due to the difference in electron affinity, resulting in the impedance of a channel formed with the accumulated electrons between an input and an output terminal being regulated depending on the voltage applied to the one or more gates.

The field effect transistors available in the prior art are classified into three types, including the junction gate type, the insulated gate type and the Schottky barrier type. Out of these three families, the insulated gate type and the Schottky barrier type (Metal semiconductor or MES) are rather easy to produce in the form of integrated circuits. Therefore, insofar as the integrated circuits are concerned, these two types are predominantly employed. For the purpose of improving the switching speed of the FETs, various means including decrease of geometrical dimensions are employed. However, improvement in switching speed is inherently limited by electron mobility or the speed of electrons moving in a conductive channel. In other words, improvement in electron mobility is the easiest means or even the essential means for improvement of the switching speed of a FET. It was believed, however, that electron mobility is determined by the kind of and the concentration of impurities doped into a semiconductor, temperature, etc., and that there is a limitation for improvement of electron mobility.

It is noted, however, that R. Dingle et al. have disclosed results of efforts for improvement of electron mobility which were successfully realized by a multilayered structure of semiconductors including plural heterojunctions. Their report entitled "Electron Mobilities in Modulation-doped Semiconductor Heterojunction Superlattices" disclosed in Applied Physics Letters, Vol. 33, Pages 665 through 667 on Oct. 1, 1978 reveals that albeit the electron mobility of GaAs doped with n-type impurities at a concentration of $10^{17}/cm^3$ is approximately 5,000 $cm^2/V.sec$ at the temperature of 300° K., a multilayered structure fabricated by alternately growing n-doped AlGaAs layers and undoped or unintentionally doped GaAs layers allows the GaAs layers to have an electron mobility of approximately 20,000 $cm^2/V.sec$ at the temperature of 77° K. This improvement in electron mobility was realized in the electrons accumulated in the GaAs layer contiguous with the heterojunction due to the difference in electron affinity, because of the lesser ionized-impurity scattering in the undoped or unintentionally doped GaAs layer at a cryogenic temperature

SUMMARY OF THE INVENTION

An object of this invention is to provide active semiconductor devices with high electron mobility.

To attain the object mentioned above, an active semiconductor device with high electron mobility in accordance with this invention is provided with a single active heterojunction formed between a pair of layers fabricated with two different semiconductors. The two different semiconductors are selected to provide a substantial difference of their electron affinities, for example GaAs and AlGaAs. Further, the semiconductor layer having the lower electron affinity is doped with an n-type impurity. Due to the difference in electron affinity, electrons contained in the semiconductor layer having the lower electron affinities are depleted and move to the semiconductor layer having the higher electron affinity. The electrons accumulate in an extremely thin region close to the single heterojunction. These accumulated electrons provide a channel. From this viewpoint, the semiconductor layer, having a lower electron affinity and the semiconductor layer having a higher electron affinity will be referred to respectively as an electron source region and a channel region. The electrons accumulated along the single heterojunction do not spread beyond the extent of an electron wave. In other words, the entire quantity of the electrons are confined in an extremely thin region with the thickness of several tens of angstroms and are spatially separated from the doped n-type impurity atoms. This means the electrons suffer less from ionized-impurity scattering. Therefore, the mobility of the electrons is significantly improved particularly at cryogenic temperature at which the effect of ionized-impurity scattering becomes dominant in determining the electron mobility. On the other hand, the electron source region is depleted to some extent. When the thickness of the electron source region is selected to a proper magnitude, it is possible to make the electron source region entirely depleted. As a result, the electrons accumulated along the single heterojunction function as the only channel for the layer configuration consisting of an electron source region and a channel region. Accordingly, when one or more insulated gates or Schottky barrier gates together with a source and a drain are placed on the top surface of the layer configuration, a FET may be fabricated with a path of electric current limited to the channel formed on the electrons accumulated along the single heterojunction.

As described earlier, it is essential for an electron source region to be doped with n-type impurity atoms. However, a channel region can be either undoped; or unintentionally doped, or n-doped, or even p-doped, unless the positive dopant concentration is extremely high.

It is noted that the thickness of an electron source region is required to be less than a specific thickness which is determined predominantly by the kind of semiconductors employed and the temperature at which the device is employed.

The above described novel concept of the present invention for active semiconductor devices with high electron mobility may be applied various manner.

Two different layer configurations are available. One is to grow a channel region on a substrate before growing an electron source region on the channel region and placing one or more gates, a source and a drain on the layer configuration. The other is to grow an electron source region on a substrate before growing a channel region on the electron source region and further placing one or more gates, a source and a drain on the layer configuration.

The former embodiment functions as either a normally-on mode (depletion mode) or a normally-off mode (enhancement mode) depending on whether the thickness of an electron source region is larger than a specific thickness which is determined predominantly by the kind of semiconductors employed and the temperature at which the device is employed.

The latter embodiment functions as either a normally-on mode (depletion mode) or a normally-off mode (enhancement mode) depending on whether the ratio of the thickness of a channel region and the thickness of an electron source region is larger than a specific amount which is determined predominantly by the kind of semiconductors employed and the temperature at which the device is employed.

In addition to the pair of GaAs and AlGaAs, the pairs of Ge and AlGaAs, Ge and GaAs, InSb and CdTe, InAs and GaSb, etc., can be utilized.

The gate or gates can be fabricated either in the form of the Schottky barrier gate type or the insulated gate type. The essential requirements are that (i) it generates a field effect and (ii) it is effective to confine electrons depleted from the layer configuration to the interface between the gate or gates and either the electron source region or the channel region.

The substrate can be fabricated with either a semiconductor or an insulator. In either case, a single heterojunction constituting a single channel connecting a source and a drain is essential.

BRIEF DESCRIPTION OF THE DRAWINGS

The invention, together with its various features and advantages, can be readily understood from the following more detailed description presented in conjunction with the following drawings, in which.

DETAILED DESCRIPTION OF THE PREFERRED EMBODIMENTS

Figure 1:
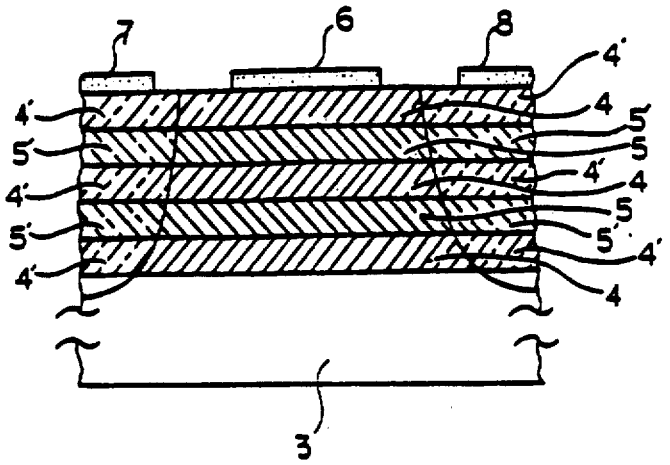
FIG. 1 shows a cross-sectional view of a FET having a multilayered superlattice structure fabricated with n-doped $Al_{0.3}Ga_{0.7}As$ layers and undoped GaAs layers interleaving a plurality of heterojunctions and which was produced for trial without success.
Figure 2:
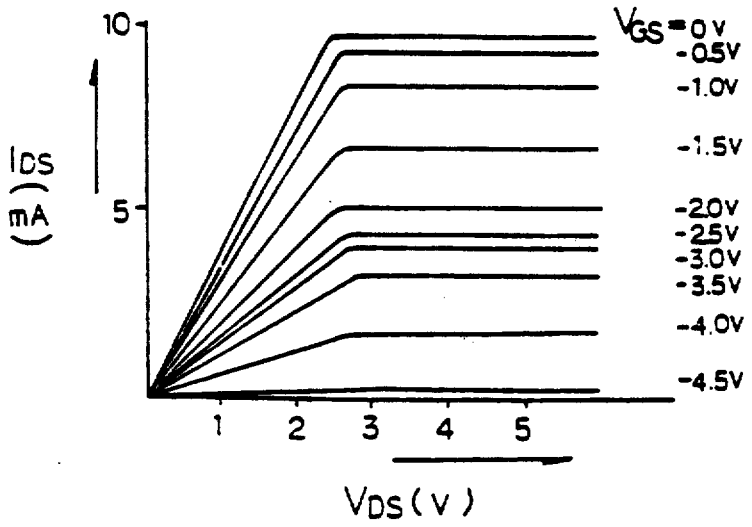
FIG. 2 shows a graph showing the source-drain voltage vs. the source-drain current characteristic determined employing the gate-source voltage as a parameter, of the FET whose layer configuration is shown in FIG. 1.

The inventor of the present invention conceived that the above mentioned phenomenon reported by R. Dingle et al. could be utilized for improvement of electron mobility and for development of a FET with an extremely high switching speed. In the experimental work leading to the present invention, first a FET was produced comprising a multilayered superlattice structure fabricated with n-doped $Al_{0.3}Ga_{0.7}As$ and undoped GaAs, as shown in FIG. 1. Referring to the same figure, plural n-doped AlGaAs layers (4) and plural undoped GaAs layers (5) are grown one after the other to form a multilayer on a GaAs substrate (3) which is a semi-insulator. Reference numerals (4') and (5') respectively show n-doped AlGaAs layers and n-doped GaAs layers for forming source and drain regions. On top of these n-doped layers, a source electrode (7) and a drain electrode (8) are placed. (These source and drain electrodes are generally referred to in the art as outputs.) A Schottky gate (6) is provided between the source (7) and the drain (8). The relations between the source-drain voltage vs. the source-drain current were measured for the above described FET, varying the gate-source voltage as a parameter. FIG. 2 shows the result of the measurement. In the same figure, the X-axis and Y-axis respectively depict the source-drain voltage $V_{DS}$ and the source-drain current $I_{DS}$. The gate-source voltage $V_{GS}$ is shown for each curve as a parameter.

Figure 3:
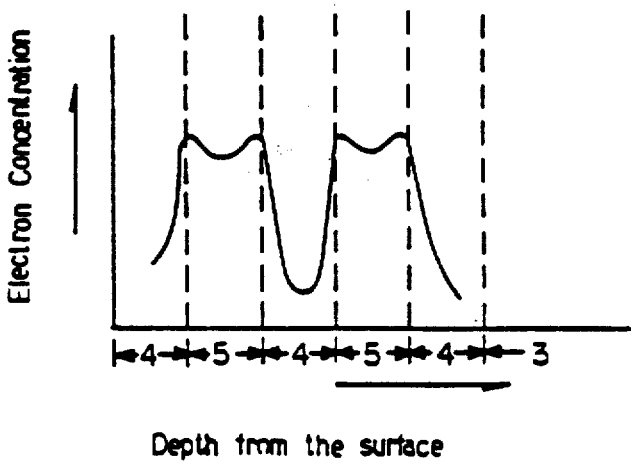
FIG. 3 shows a graph showing the electron concentration vs. the depth from the surface of the layer configuration shown in FIG. 1.

FIG. 2 shows that the transfer conductance Gm of this FET is non-linear for the gate-source voltage $V_{GS}$. For example, the transfer conductance Gm is extremely small for the gate-source voltage range of $-2.0\ V \leqq V_{GS} \leqq -3.0\ V$. Further, The amplification characteristic is also non-linear. Therefore, it is clear that this FET cannot be applicable for practical use. In order to determine the causes of such a characteristic, the relations between the electron concentration and the depth from the top surface were measured. FIG. 3 shows the result of the measurement. The figure shows a large electron concentration for the undoped GaAs layers (5) which have a relatively larger electron affinity, and a small electron concentration for the n-type AlGaAs layers (4) which have a smaller electron affinity. Based on the fact that an increasingly larger gate-source voltage $V_{GS}$ causes the electrons located at an increasingly deeper region to be involved with conduction, it was determined that the non-linear distribution of electron concentration shown in FIG. 3 is the cause for the non-linear characteristic between the transfer conductance Gm and the gate-source voltages $V_{GS}$ shown in FIG. 2.

Based on the above described experimental results, it was determined that a multilayered structure of semiconductors including plural heterojunctions as shown in FIG. 1 is not appropriate for production of a semiconductor device.

Figure 4:
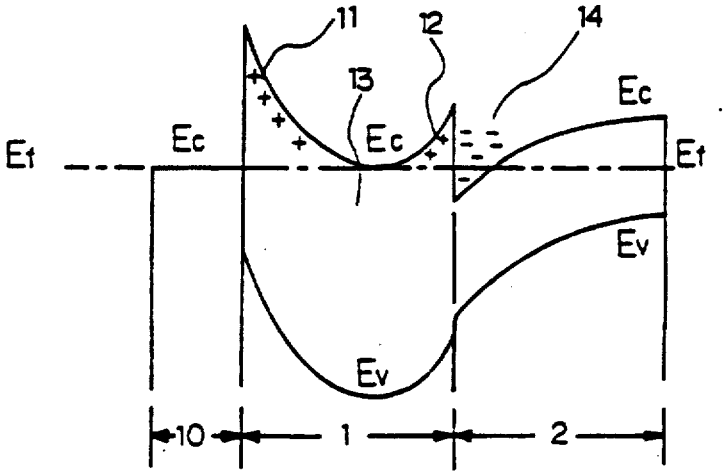
FIG. 4 shows an energy band diagram of a layer configuration constituted with a metal layer, an $Al_{0.3}Ga_{0.7}As$ layer and an undoped GaAs layer interleaving a single heterojunction between them, under thermal equilibrium.

Thereafter, the case was studied in which a single heterojunction is formed between two kinds of semiconductors having different electron affinities from each other. With reference to the drawings, the results of the study are described below. FIG. 4 shows the energy band diagram of a layer configuration interleaved by a single heterojunction formed between an n-type $Al_{0.3}Ga_{0.7}As$ layer and an undoped GaAs layer, thermal equilibrium. Referring to the same figure, a metal layer (10) makes a Schottky contact with an n-type AlGaAs layer (1). A GaAs layer (2) forms a single heterojunction with the n-type AlGaAs layer (1). From a functional viewpoint, the GaAs layer (2) is allowed to be either undoped or n-doped to a certain extent or even p-doped to a rather less extent. Reference characters $E_C$, $E_V$ and $E_f$ respectively show the energies of the conduction band, the valence band and the Fermi level. Due to the Schottky effect, some quantity of electrons contained in the n-type AlGaAs layer (1) move into the interface between the metal layer (10) and the AlGaAs layer, leaving depletion region in the form of a layer (11) in the n-type AlGaAs layer. As a result, the energy band diagram is shaped as depicted in the same figure. In addition, due to the difference in electron affinity, some of the electrons contained in the n-type AlGaAs layer (1) move into the GaAs layer (2) across the heterojunction formed between them. As a result, the energy band diagram is shaped as depicted in the same figure. It is noted that if the thickness of the n-type AlGaAs layer (1) exceeds a certain amount, an n-type layer (13) remains between the depletion layers (11) and (12). The electrons depicted from the n-type AlGaAs layer (1) accumulate along the heterojunction, forming an electron accumulation (14) in the GaAs layer (2). As a result, the energy band diagram is shaped as depicted in the same figure. The thickness of the electron accumulation (14) does not exceed the spread of an electron wave which is tens of angstroms.

FIG. 4 shows a case in which the magnitude of the Schottky barrier between the metal layer (10) and the n-type AlGaAs layer (1) is larger than the barrier gap which appears between the GaAs layer (2) and the n-type AlGaAs layer (1) due to the difference in electron affinities. However, a certain thickness of an n-type layer (13) remains between the two depletion layers (11) and (12) which effectively keeps the two depletion layers (11) and (12) independent from each other and prevents them from interfering with each other. In other words, the electrons depleted from the depletion layer (11) accumulate along the Schottky surface, and the electrons depleted from the depletion layer (12) independently accumulate in the GaAs layer (2) along the heterojunction to form the electron accumulation (14).

This potential condition does not allow a field effect caused by a positive or negative voltage applied to the metal layer (10) to affect the electron accumulation (14). Moreover, the remaining n-type layer in which the electron mobility is relatively low forms another conductive channel between the source and drain and consequently deteriorates the linearity of the characteristics and the switching speed of the device. Therefore, it is clear that this layer configuration is not satisfactory as an active device.

Figure 5:
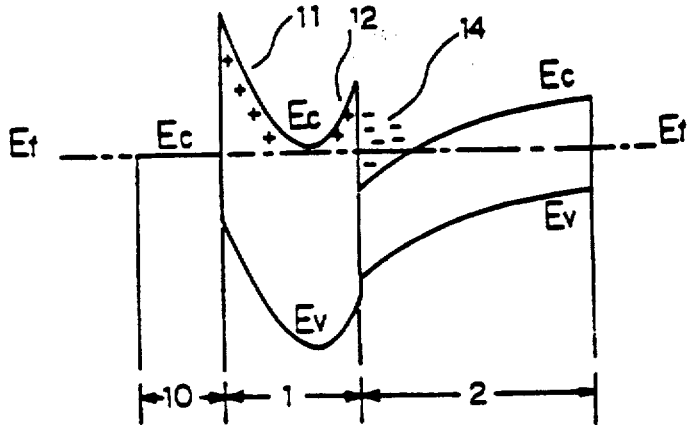
FIG. 5 shows an energy band diagram of a layer configuration which depicts a boundary of the thickness of an n-doped AlGaAs layer which allows regulation of conductivity with a field effect caused by a metal layer, under thermal equilibrium.
Figure 6:
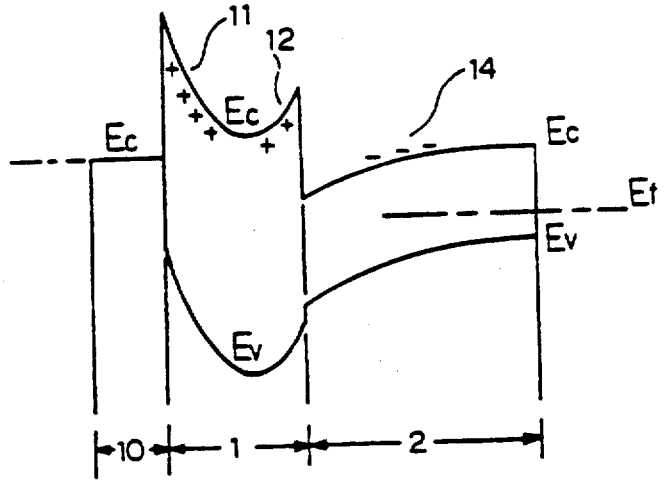
FIG. 6 shows an energy band diagram corresponding to the diagram shown in FIG. 5, but showing the field effect, FIG. 7 (a) shows an energy band diagram corresponding to FIG. 5, showing the case in which the barrier gap between a metal layer and an n-doped AlGaAs layer is larger than the barrier gap between the AlGaAs layer and a GaAs layer, under thermal equilibrium, FIG. 7 (b) shows an energy band diagram corresponding to FIG. 5, showing the case in which the barrier gap between an n-doped AlGaAs layer and a GaAs layer is larger than the barrier gap between the AlGaAs layer and a metal layer, under thermal equilibrium.

The layer configuration shown in FIG. 4 should not include an N layer (13) constituting a conductive bulk region in the n-type AlGaAs layer (1), that is, the n-type AlGaAs layer (1) will include only the depletion regions or layers (11) and (12), when the thickness of the n-type AlGaAs layer is sufficiently decreased. An example of this condition is shown in FIG. 5. When a negative voltage is applied to the metal layer (10), a depletion layer spreads into the GaAs layer (2). As a result, since the energy band diagram is shaped as shown in FIG. 6, the electron concentration of the electron accumulation (14) decreases. This means that the conductivity of a channel constituted by the electron accumulation (14) formed in the GaAs layer (2) along the single heterojunction can be regulated by application of a negative potential applied to the metal layer (10).

Figure 7:
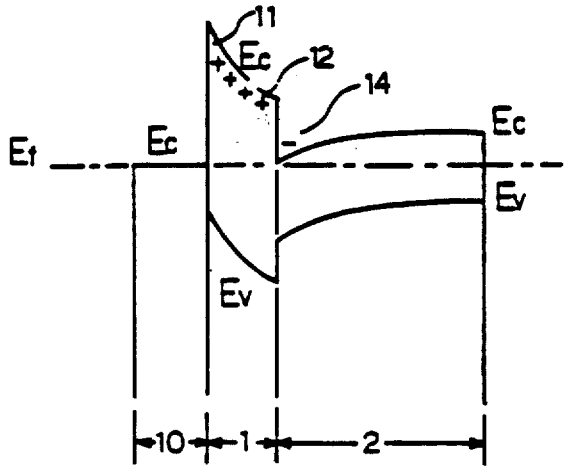
Figure 7:
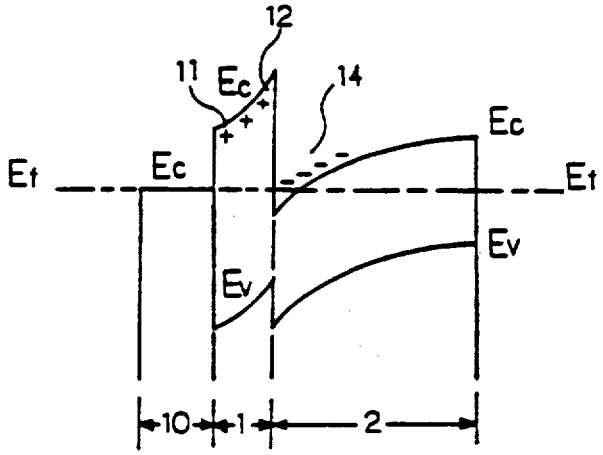

Albeit FIGS. 5 and 6 show the case in which the Schottky barrier between the metal layer (10) and the n-type AlGaAs layer (1) is larger than the barrier gap between the GaAs layer (2) and the n-type AlGaAs layer (1) due to the difference in electron affinity, the other case in which the magnitude of the barrier gaps is reversed is also possible. In each case, a different function results. Namely, when the thickness of the n-type AlGaAs layer (1) is further decreased, two different shapes as shown in FIGS. 7 (a) and 7 (b) are available for the energy band diagram. FIG. 7 (a) shows a case in which the barrier gap between the metal layer (10) and the n-type AlGaAs (1) is larger than barrier gap which appears between the GaAs layer (2) and the n-type AlGaAs layer (1) due to the difference in electron affinity. If the thickness of the n-type AlGaAs layer (1) is further decreased, the depletion layer (12) will not appear. In this case, the concentration of the electron accumulation (14) becomes extremely small, and this thickness of the n-type AlGaAs layer (1) constitutes a boundary of the range in which the negative regulation of conductivity is possible. On the other hand, FIG. 7 (b) shows a case in which the barrier gap between the metal layer (10) and the n-type AlGaAs layer (1) is smaller than the barrier gap which appears between the GaAs layer (2) and the n-type AlGaAs layer (1) due to the difference in electron affinity. If the thickness of the n-type AlGaAs layer (1) is further decreased, the depletion layer (11) does not appear. In this case, albeit some means is necessary to confine electrons along the interface between the metal layer (10) and the n-type AlGaAs layer (1), this thickness of the n-type AlGaAs layer (1) does not constitute a boundary of the range in which the negative regulation of conductivity is possible. In other words, this thickness of the n-type AlGaAs layer (1) still allows the negative regulation of conductivity.

Figure 8:
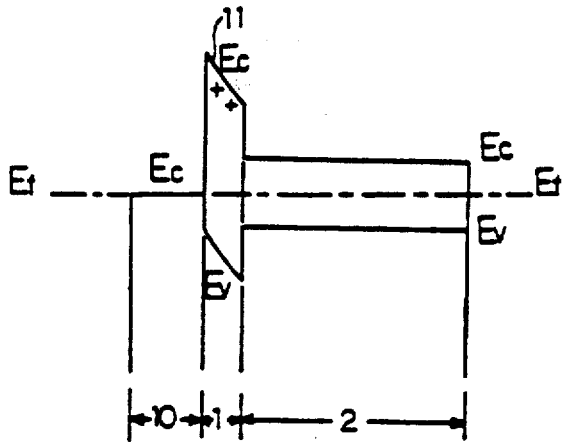
FIG. 8 shows an energy band diagram corresponding to FIG. 7(a), showing the case in which the thickness of an n-doped AlGaAs layer is thinner; under thermal equilibrium.
Figure 9:
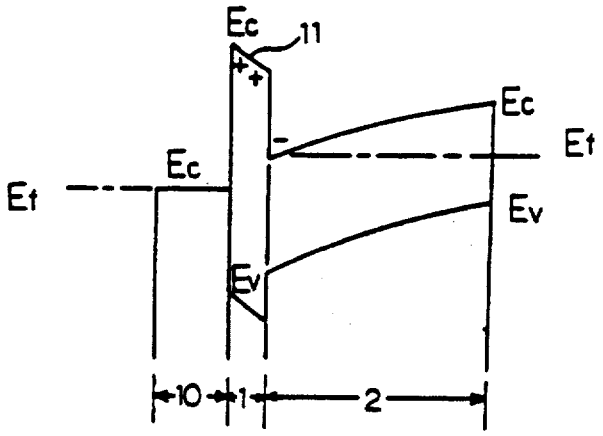
FIG. 9 shows an energy band diagram showing the same layer configuration as for FIG. 8, showing the influence of a field effect.

Referring again to FIG. 7 (a), when the thickness of the n-type AlGaAs layer (1) is further decreased, no electrons are supplied to the GaAs layer (2), and the electron accumulation (14) does not appear, as shown in FIG. 8 under thermal equilibrium. Therefore, a positive voltage applied to the metal layer (10) causes an electron accumulation (14) in the GaAs layer (2) due to the function of a capacitor constituted with the metal layer (10), the depletion layer (11) and the GaAs layer (2). As a result, the energy band diagram is changed as shown in FIG. 9. This means that a positive regulation of conductivity is possible for this layer configuration.

It has become clear that active semiconductor devices with high electron mobility can be produced by growing an n-type semiconductor layer having a smaller electron affinity on a semiconductor layer having larger electron affinity, before one or more gates of a rectifying or non-conductive material and a source and a drain are placed on the semiconductor layers.

Figure 10:
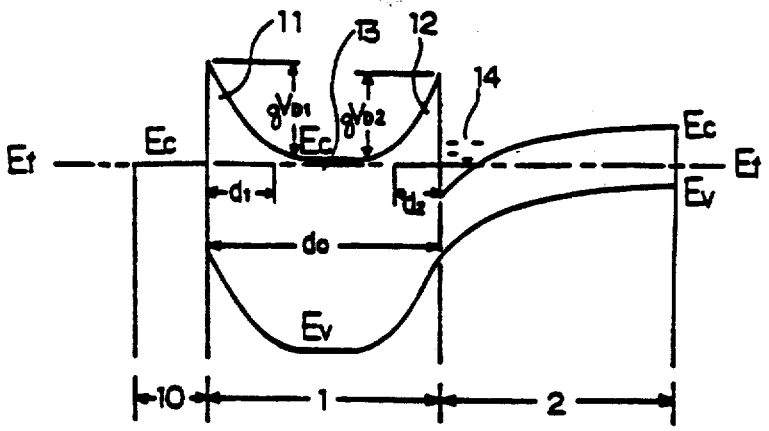
FIG. 10 shows an energy band diagram equivalent to FIG. 4, for defining various variables.

The numerical limitations for the thickness of the n-type AlGaAs layer (1) which were referred to above will be discussed. At first, referring to FIG. 10 which is virtually identical to FIG. 4, each variable is defined below. $V_{D1}$ is the height of the potential barrier between the metal layer (10) and the n-type AlGaAs layer (1). In other words, as shown in FIG. 10, $V_{D1}$ is the potential difference between the peak in the bottom of the conduction band formed at the boundary with the control terminal and the semiconductor (AlGaAs) layer 1 and the illustrated flat portion of the bottom of the conduction band that forms when the semiconductor layer 1 is sufficiently thick to form the flat portion. As is well known, the height of the potential barrier $V_{D1}$ corresponds to the difference between the work function of the control terminal and the electron affinity of the semiconductor layer. The thickness of the depletion layer (11) is depicted by $d_1$. $V_{D2}$ is the height of the energy barrier in the n-type AlGaAs layer (1) at the junction with the GaAs layer (2). In other words, as with $V_{D1}$, $V_{D2}$ is the potential difference between the peak in the bottom of the conduction band formed at the heterojunction boundary in the semiconductor layer 1 and the illustrated flat portion in the bottom of the conductor band, as shown in FIG. 10. The thickness of the depletion layer (12) is depicted $d_2$. The thickness of the n-type AlGaAs layer (1) is depicted by $d_0$. The total thickness d of the two depletion layers (11) and (12) is $$d = d_1 + d_2 = \left(\frac{2\epsilon S}{qN_D}\right)^{\frac{1}{2}} \{(V_{D1} - kT/q)^{\frac{1}{2}} + (V_{D2} - kT/q)^{\frac{1}{2}}\} \quad (1)$$

wherein, $N_D$ is the impurity concentration of the n-type AlGaAs layer (1), $\epsilon_S$ is the dielectric constant of the n-type AlGaAs layer (1), q is the charge of an electron, k is the Boltzmann constant, and T is the absolute temperature at which a device works.

(The formulations herein ignore the small energy gap shown in FIG. 10 between the bottom of the conduction band in the source layer and the Fermi level, this gap depending on the impurity type.) The upper limit ($d_0$) of the thickness range of the n-type AlGaAs layer (1) which allows the negative regulation of conductivity, that is, which allows the condition shown in FIGS. 5 and 6, is $$d_0 \simeq d_1 + d_2 \quad (2)$$

In other words, the higher limit ($d_0$) must be identical to the cumulative thickness of the two depletion layers (11) and (12). The layer configuration which satisfies this thickness limitation allows regulation of the concentration of the electron accumulation (14) with a negative voltage applied to a gate. This conclusion was proved for the layer configuration described above containing a 800-angstrom AlGaAs layer with a donor concentration of $6\times10^{17}/cm^3$. The surface electron concentration $N_S$ of the electron accumulation (14), determined by utilization of the Hall effect, showed a linear change from $8\times10^{11}/cm^2$ to $2\times10^{11}/cm^2$ for the gate-source voltage variation between 0 V (zero volt) and −3.5 V.

As described earlier, the thickness ($d_0$) range of the n-doped AlGaAs layer (1) workable as an active device is $$0 < d_0 \leqq d_1 + d_2 \quad (3)$$

Within this thickness range, however, the function varies depending on specific conditions.

In the case where the energy barrier ($V_{D1}$) between the metal layer (10) and the n-type AlGaAs layer (1) is less than the energy barrier ($V_{D2}$) between the n-type AlGaAs layer (1) and the GaAs layer (2) due to the difference in electron affinity, namely in the case of $V_{D1}/V_{D2}$, the electron accumulation (14) is always available in the GaAs layer (2) as shown in FIG. 7 (b), regardless of the thickness of the n-type AlGaAs layer (1). Therefore, regardless of the thickness of the n-doped AlGaAs layer (1), regulation for conductivity is possible for this layer configuration with a negative voltage applied to a gate. As a result, under these conditions, this layer configuration can be utilized as a normally-on mode (depletion mode) FET. Within this thickness range, variation in thickness corresponds to variation in characteristics. Namely, a lesser thickness of the n-type AlGaAs layer (1) causes a lesser electron concentration for the electron accumulation (14). In this case, however, a larger influence of the field effect due to the lesser thickness of the n-type AlGaAs layer (1) causes a better sensitivity.

In the case where the energy barrier ($V_{D1}$) between the metal layer (10) and the n-type AlGaAs layer (1) is larger than the energy barrier ($V_{D2}$) between the n-type AlGaAs layer (1) and the GaAs layer (2) due to the difference in electron affinity, namely in the case of $V_{D1} > V_{D2}$, the situation differs depending on whether the thickness ($d_0$) of the n-type AlGaAs layer (1) is $$d_1 < d_0 \leqq d_1 + d_2 \quad (4)$$

or $$0 < d_0 \leqq d_1 \quad (5)$$

In the case where the inequality (4) is satisfied, the band diagrams shown in FIGS., 5. 6 and 7 (a) are realized. In the case where the inequality (5) is satisfied, the band diagrams shown in FIGS. 8 and 9 are realized. In the former case, since the electron accumulation (14) is available in the GaAs layer (2), regulation for conductivity is possible with a negative voltage applied to a gate. Therefore, a normally-on mode (depletion mode) FET can be produced with this layer configuration. In the latter case, regulation for conductivity is possible with a positive voltage applied to a gate. Therefore, a normally-off mode (enhancement mode) FET can be produced with this layer configuration. In the case of $d_0 = d_1$, the pinch-off voltage becomes 0 V (zero volts). Within this thickness range, variation in thickness corresponds to variation in characteristics. Namely, a lesser thickness of the n-type AlGaAs layer (1) causes a lesser electron concentration for the electron accumulation (14). In this case, however, a larger influence of the field effect due to the lesser thickness of the n-type AlGaAs layer (1) causes a better sensitivity.

It is needless to emphasize that not only a Schottky barrier gate but also an insulated gate is useful in the present invention.

One example of a production method will be described below for each of the normally-on mode (depletion mode) FET and the normally-off mode (enhancement mode) FET, supposing that $Al_{0.3}Ga_{0.7}As$ and GaAs are respectively employed for fabrication of an electron source region and a channel region.

Figure 11:
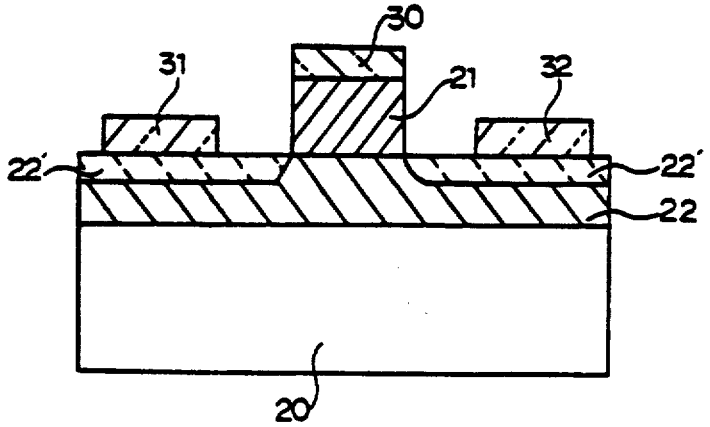
FIG. 11 shows a cross-sectional view of a FET workable in the normally-on mode, in accordance with an embodiment of this invention.

FIG. 11 shows a completed normally-on mode (depletion mode) FET in accordance with this invention. The first step is to grow a GaAs layer with the thickness of approximately 3,000 angstroms of a non-conductive or semi-insulator GaAs substrate (20) employing for example an MBE (Molecular Beam Epitaxy) process. Reference numeral (22) depicts the GaAs layer or the channel region. The impurity concentration is freely selected for the channel region, although it is preferable if it is *not* highly doped, undoped or marginally p-type or n-type. The second step is to grow an AlGaAs layer with the thickness of approximately 800 angstroms on the channel region (22) employing for example an MBE process. This AlGaAs layer or the electron source region (21) is doped with Si to $6 \times 10^{17}/cm^3$. The third step is to fabricate an aluminum gate (30) employing evaporation and lithography processes, before removing a portion of the electron source region (21) except under the gate (30). The fourth step is to introduce some dopant into the surface of the channel region (22') for reduction of resistance. The fifth step is to fabricate source and drain ohmic contacts by means of a metallization with gold-germanium eutectic alloy.

The height of the Schottky barrier between the aluminum and the n-type AlGaAs is 1.5 V, and the energy gap between AlGaAs and GaAs due to the difference in electron affinity is 0.4 V. Since the dielectric constant of AlGaAs is 11 (eleven), the $d_0$ of the equation (1) is $$d_0 = d_1 + d_2 = 550\ \text{Å} + 280\ \text{Å} = 830\ \text{A}$$

Therefore, the n-doped AlGaAs layer with the thickness of 800 angstroms is entirely depleted to cause the electron accumulation in the channel region (22). As a result, this device functions as a normally-on mode (depletion mode) FET. Measurement of the source-drain current vs. the source-drain voltage characteristic at 300° K. and 77° K. successfully demonstrated that the transfer conductance $G_m$ is considerably improved for this device.

Figure 12:
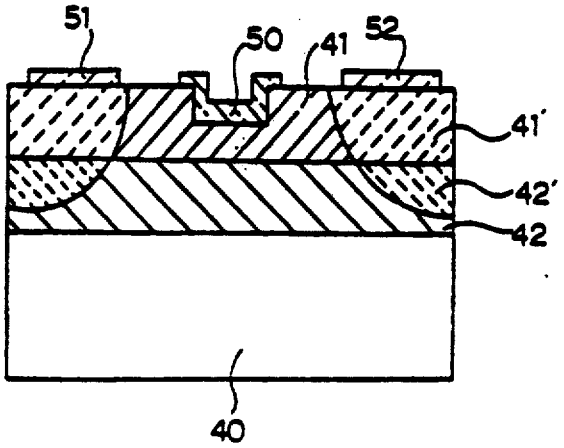
FIG. 12 shows a cross-sectional view of a FET workable in the normally-off mode, in accordance with an embodiment of this invention.

FIG. 12 shows a completed normally-off mode (enhancement mode) FET in accordance with this invention. The production method is quite similar to that which was described above. The major differences are that the thickness of the n-type AlGaAs is 700 angstroms, that the thickness of the n-type AlGaAs is partly decreased to 400 angstroms under the gate electrode and the doping depth is rather deep for the source and drain region. Reference numerals (40), (41), (42), (41') and (42') show respectively a nonconductive substrate, an n-type AlGaAs layer (an electron source region), a GaAs layer (a channel region), and doped regions of the two layers for contacting the source and drain. Reference numerals (50), (51) and (52) are respectively a gate, a source and a drain.

Since the thickness of the electron source region (41) is reduced to 400 angstroms under the gate (50), the requirement of the equation (5), that $0 < d_0 \leqq d_1$, is satisfied, and no electron accumulation is thus allowed in the channel region insofar as the portion under the gate is concerned. On the other hand, the source (51) and the drain (52) keep contact with the channel constituted by the electron accumulation. Therefore, this device functions as a normally-off mode (enhancement mode) FET. Measurement of the source-drain current vs. the source-drain voltage characteristic at 300° K. and 77° K. successfully demonstrated that the tranfer conductance $G_m$ is considerably improved for this device.

It has become clear that in accordance with this invention, active semiconductor devices with high electron mobility particularly at cryogenic temperatures are provided.

Further, it has been demonstrated that the electron mobility in the electron accumulation formed along the heterojunction of a layer configuration in accordance with this invention is improved not only at cryogenic temperatures but also at ordinary ambient temperature, albeit the magnitude of the improvement is not so significant as at the cryogenic temperature.

Figure 13:
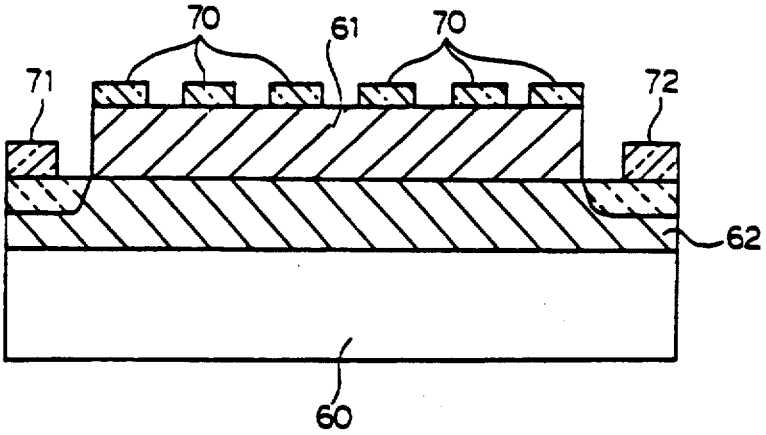
FIG. 13 shows a cross-sectional view of a charge coupled device in accordance with this invention.

It is clear that this invention can be embodied in charge coupled devices as shown in FIG. 13. Referring to the figure, reference numerals (60), (61), (62), (70), (71) and (72) show respectively a substrate, an electron source region, a channel region, gates output terminals.

Hereafter, another embodiment will be described. In this embodiment, the layer configuration is the reverse of that which was described above. Namely, an electron source region is fabricated on a non-conductive substrate, before a channel region is fabricated thereon.

Figure 14:
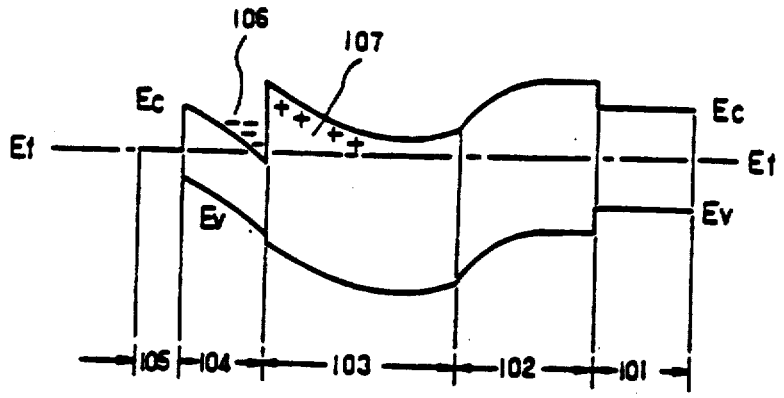
FIG. 14 shows a layer configuration and the energy band diagram of another embodiment of this invention, in which a channel region is overlaid on an electron source region, under thermal equilibrium.

FIG. 14 shows the energy and diagram of a layer configuration in accordance with this embodiment, interleaved by a single heterojunction formed between a non-doped GaAs layer and an n-type $Al_{0.3}Ga_{0.7}As$ layer, illustrated under the condition of thermal equilibrium. Referring to the same figure, a metal layer (105) makes a Schottky contact with a GaAs layer (104). An n-type AlGaAs layer (103) forms a heterojunction with the GaAs layer (104). Reference numerals (102) shows a high resistivity buffer layer of intrinsic or undoped AlGaAs which is grown on a non-conductive or semi-insulator GaAs substrate (101). Due to the difference in electron affinity, some of the electrons from in the n-type AlGaAs layer (103) move into the GaAs layer (104) across the heterojunction formed between them. As a result, the energy band diagram is shaped as depicted. These electrons (106) accumulate along the heterojunction in an extremely small thickness. This electron accumulation (106) provides a channel. The conductivity of this channel which has a high electron mobility can be regulated by a negative voltage applied to the metal layer (105). This is the fundamental concept of this invention, as described above.

In addition to this function which is the normally-on [moe] *mode* (depletion mode), a certain thickness condition allows the reverse mode or the normally-off mode (enhancement mode) for this layer configuration. Namely, when the ratio of the thickness of the channel region to the electron source region exceeds a specific amount, the layer configuration allows a normally-on mode (depletion mode) and when the ratio of the thickness of the channel region to the electron source region does not exceed a specific amount, the layer configuration allows a normally-off mode (enhancement mode).

Figure 15:
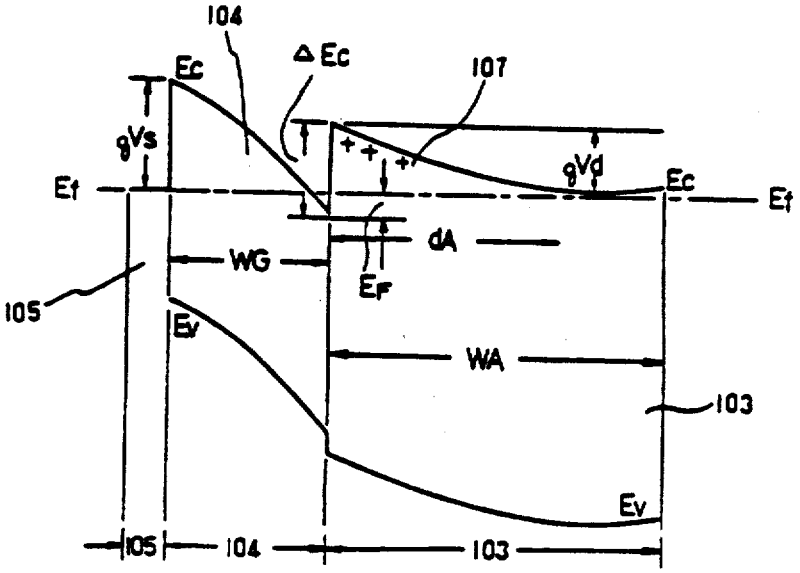
FIG. 15 shows an energy band diagram equivalent to that which is shown in FIG. 14, for defining various variables.

For convenient reference to parameters determining the thickness of the channel region (GaAs layer 104) to the electron source region (n-doped AlGaAs layer 103), a portion of FIG. 14 is drawn as FIG. 15. Referring to FIG. 15, independently of which type of contact (either Schottky barrier type of insulated gate type) is applied for the contact between the metal layer (105) and the GaAs layer (104), some electrons move from the GaAs layer (104) to the interface between the GaAs layer (104) and the metal layer (105). As a result, a surface potential $V_S$ is formed. It is noted that the amount of this surface potential $V_S$ does not vary depending on the kind of the metal employed for the metal layer (105) nor on the impurity concentration of the GaAs layer (104) due to the surface Fermi level pinning effect. On the other hand, the energy gap $\Delta E_C$ which appears along the heterojunction between the GaAs layer (104) and the n-type AlGaAs layer (103) is determined by the difference in electron affinity of the materials constituting the heterojunction. Therefore, when the thickness $W_G$ of the GaAs layer (104) is sufficiently small, a condition is available in which no electron accumulation (106) is allowed in the GaAs layer. Under this condition, the layer configuration functions in a normally-off mode (enhancement mode), while outside this condition the layer configuration functions in a normally-on mode (depletion mode). This is the functional principle of this embodiment.

The numerical limitations for the thicknesses of the GaAs layer (104) and the n-type AlGaAs layer (103) will be indicated below. At first, referring again to FIG. 15, each variable is defined below. $N_S$ is the surface concentration of electrons accumulated along the heterojunction between the GaAs layer (104) and the n-type AlGaAs layer (103). As described above, $W_G$ depicts the thickness of the GaAs layer (104). $d_A$ and $W_A$ are respectively the thickness of the depletion layer which appears in the n-type AlGaAs layer (103) and the thickness of the n-type AlGaAs layer (103). $V_D$ is the energy barrier appearing in the n-type AlGaAs layer (103) due to depletion of electrons. $E_F$ is the difference between the energy level at the bottom of the conduction band in the GaAs layer (104) at the point of discontinuity appearing at the heterojunction and the Fermi level $E_f$. The dielectric constants of $Al_{0.3}Ga_{0.7}As$ and GaAs are respectively represented by $\epsilon_{SA}$ and $\epsilon_{SG}$. $N_D$ is the donor impurity concentration of the n-type AlGaAs layer (103). The thickness of $d_A$ of the depletion layer appearing in the n-doped AlGaAs layer is $$d_A = \left(\frac{2\epsilon SA}{q \cdot N_D}\right)^{\frac{1}{2}} \cdot \left(V_D - \frac{k \cdot T}{q}\right)^{\frac{1}{2}} \quad (6)$$

wherein, k is the Boltzman constant,

T is the absolute temperature at which a device works, and q is the absolute value of the charge of an electron.

On the other hand, since all of the electrons accumulated along the heterojunction must have moved from the depletion layer in the n-type AlGaAs layer, $$N_S = N_D \cdot d_A \quad (7)$$

The equations (6) and (7) yield $$N_S = \frac{2\epsilon SA}{q \cdot d_A} \cdot \left(V_D - \frac{k \cdot T}{q}\right) \quad (8)$$

Further, on the assumption that the potential distribution is linear in the GaAs layer (104), the surface electron concentration $N_S^0$ necessary to cause the surface potential $V_S$ between the metal layer (105) and the GaAs layer (104) is $$N_S^0 = \frac{\epsilon SG}{q \cdot W_G} \cdot V_S \quad (9)$$

As described earlier, the surface potential $V_S$ has an almost constant value. Therefore, supposing that the thickness of the GaAs layer (104) is so small that the electrons which are necessary to generate the surface potential $V_S$ are supplied from the depletion layer (107), the condition for allowing electron accumulation (106) along the heterojunction is $$N_S > N_S^0 \quad (10)$$

The condition for inhibiting electron accumulation (106) along the heterojunction is $$N_S \leqq N_S^0 \quad (11)$$

As a result, the condition for the normally-on mode (depletion mode) is $$\frac{2\epsilon SA}{q \cdot d_A} \cdot \left(V_D - \frac{kT}{q}\right) > \frac{\epsilon SG}{q \cdot W_G} \cdot V_S \quad (12)$$

$$\frac{W_G}{d_A} > \frac{1}{2} \cdot \frac{V_S}{V_D - \frac{k \cdot T}{q}} \cdot \frac{\epsilon SG}{\epsilon SA}$$

Since the n-doped AlGaAs layer (103) is to be entirely depleted in accordance with this invention, the thickness $W_A$ is less than the thickness of the depletion layer $d_A$. Therefore, the thickness $W_A$ should be selected to meet the following inequality (13).

$$W_A \leqq \left(\frac{2\epsilon SA}{q \cdot N_D}\right)^{\frac{1}{2}} \cdot \left(V_D - \frac{k \cdot T}{q}\right)^{\frac{1}{2}} \quad (13)$$

Further, under this condition defined by the inequality (13), the surface concentration $N_S$ is determined by the thickness $W_A$ of the layer (103) rather than $d_A$ because the buffer layer (102) cannot provide substantially any electrons to the channel. Therefore, $W_A$ should be substituted for $d_A$ in the inequality (12), which is rewritten as $$\frac{W_G}{W_A} > \frac{1}{2} \cdot \frac{V_S}{V_D - \frac{k \cdot T}{q}} \cdot \frac{\epsilon SG}{\epsilon SA} \quad (14)$$

Since $q.V_D = \Delta E_C - E_F$ (neglecting the small energy gap shown in FIG. 15 between th bottom of the conduction band at the right side of the source layer and the Fermi level, which depends on the type of impurity) from the above definition, the inequality (14) is modified to $$\frac{W_G}{W_A} > \frac{1}{2} \cdot \frac{qV_S}{\Delta E_C - E_F - kT} \cdot \frac{\epsilon SG}{\epsilon SA} \quad (15)$$

In conclusion, this inequality presents a condition which allows this layer configuration to function as a normally-on mode (depletion mode) FET. The other condition, which does not satisfy the above inequality, presents a condition which allows this layer configuration to function as a normally-off mode (enhancement mode) FET. Namely, as described earlier, when the ratio of the thickness of a channel region and the thickness of an electron source region is larger than the amount representing the right side of the above inequality, the above described layer configuration provides active semiconductor devices such as a FET workable in the normally-on mode (depletion mode); and when the ratio of the thickness of a channel region and the thickness of an electron source region is equal to or less than the amount representing the right side of the above inequality, the above described layer configuration provides active semiconductor devices such as a FET workable in the normally-off mode (enhancement mode). In any case, the equality (13) should be satisfied in accordance with the present invention.

One example of a production method will be described below for each of the normally-on mode (depletion mode) FET and the normally-off mode (enhance mode) FET, supposing that $Al_{0.3}Ga_{0.7}As$ and GaAs are respectively employed for fabrication of an electron source region and a channel region.

Figure 16:
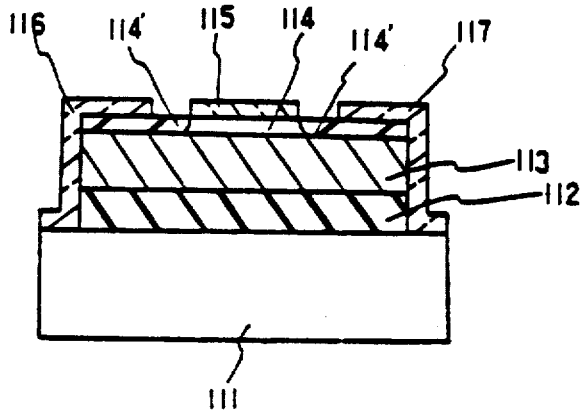
FIG. 16 shows a cross-sectional view of a FET workable in the normally-off mode, in accordance with another embodiment of this invention.

FIG. 16 shows a completed normally-off mode (enhancement mode) FET in accordance with this embodiment. The first step is to grow an undoped or unintentionally doped AlGaAs layer or a buffer layer (112) with the thickness of approximately 1 μm on a non-conductive or semi-insulator GaAs substrate (111) employing for example an MBE process. The purposes of this undoped AlGaAs layer or the buffer layer (112) are to improve the crystal condition of an AlGaAs layer or an electron source region (113) which is grown thereon and to prevent electrons from dispersing elsewhere. Further, this buffer layer also prevents an impurity diffusion from the substrate to the active layers even when the substrate contains a deep level impurity such as iron or chromium, to increase its resistivity, which could otherwise deteriorate the performance of the device when diffused into the active layers. Therefore, this process is not an essential process for this invention, although it is preferably employed. The second step is to grow an AlGaAs layer or an electron source region (113) with the thickness of approximately 500 angstroms on the substrate (111) or the buffer layer (112) employing for example an MBE process in succession to the first step. The AlGaAs layer (113) is doped with Si to $6 \times 10^{17}/cm^3$. The third step is to grow a GaAs layer or a channel region (114) with the thickness of approximately 400 angstroms on the AlGaAs layer (113) employing for example an MBE process in succession to the first and second steps. As described earlier in connection with the GaAs layer 2 of FIG. 4, the impurity concentrated of this GaAs layer (114) may be freely selected, except that it may not be highly doped. Due to the inherent purpose of this invention which is to improve the electron mobility particularly at cryogenic temperatures by reducing the effects of ionized-impurity scattering, a lesser impurity concentration is preferable. The fourth step is to fabricate an aluminum gate (115) employing evaporation and lithography processes. The fifth step is to employ a process, for example an ion implantation process, for introduction of an n-type dopant to the surface of the channel layer (114) for production of regions (114') in which the resistance is reduced. The sixth step is to fabricate source (116) and drain (117) ohmic contacts with gold-germanium eutectic alloy metallization.

Since the AlGaAs employed for fabrication of this FET has the X amount of 0.3, $$\frac{1}{q}(\Delta E_C - E_F - kT) \approx 0.3 \text{ V}$$

It is clear that $\epsilon_{SG} = \epsilon_{SA}$, and $$V_S \approx 0.6 \text{ V}$$

Therefore, the right side of the inequality (14) or (15) is unity. On the other, the value of SG/WA is 4.5. As a result, this FET is allowed to function in the normally-off mode (enhancement mode).

A differential capacity feedback profiler was employed for measurement of the carrier distribution in this FET. Since the measurement of carrier distribution was possible for the gate-source voltage $V_{GS}$ range of 0 v (zero volt) through +0.5 V, it is clear that this FET functions in the normally-off mode (enhancement mode).

Figure 18:
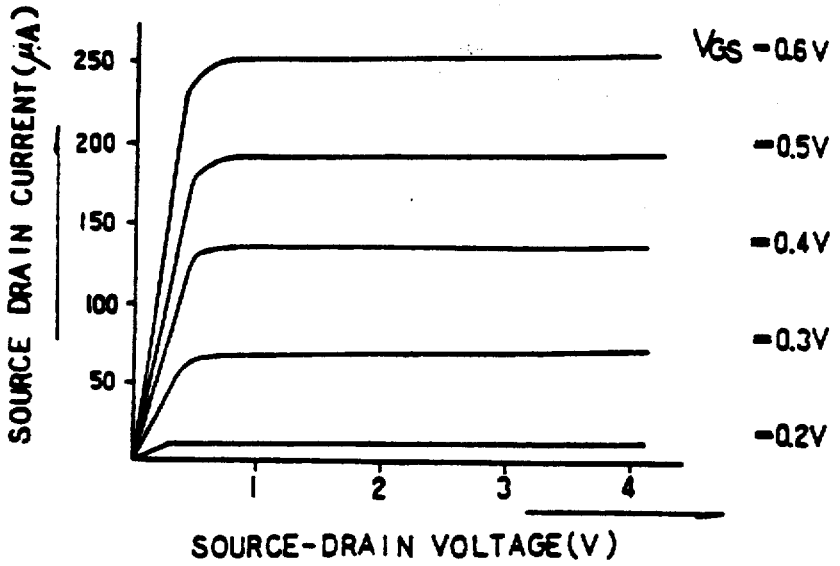
FIG. 18 shows a graph showing the source-drain current vs. the source-drain voltage characteristic determined employing the gate-source voltage as a parameter, of the FET whose layer configuration is shown in FIG. 16.

Further, the source-drain current vs. the source-drain voltage characteristic was measured for the FET with a gate length of 2 μm and a gate width of 150 μm employing the gate-source voltage as the parameter. FIG. 18 shows a result of the measurement which was carried out at 77° K. For comparison, a similar measurement was carried out also at 300° K (not shown). The result was a considerable improvement (of more than 5 times) of the characteristics at the lower temperature.

Figure 17:
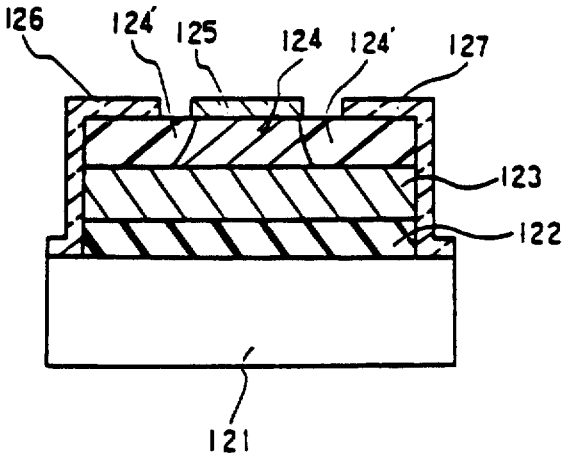
FIG. 17 shows a cross-sectional view of a FET workable in the normally-on mode, in accordance with another embodiment of this invention.

FIG. 17 shows a completed normally-on mode (depletion mode) FET in accordance with this embodiment. The production process is quite similar to the process for the normally-off mode (enhancement-mode) FET described above, except that the thickness of the channel region (124) is 2,000 angstroms rather than 400 angstrom. In this case, since the ratio of the thickness of the channel region. $W_G$ and that of the electron source region $W_A$ is 4.0, it definitely exceeds the amount of the right side of the inequality (14) or (15), which in this case is unity. Therefore, this FET functions in the normally-on mode (depletion mode). The reference numerals (121), (122) and (123) respectively show a substrate, a buffer layer, an electron source region or an n-type AlGaAs layer and a channel region or a non-doped GaAs layer. The reference numeral (124') shows highly doped regions for a source contact (126) and a drain contact (127).

A differential capacitance feedbacker profiler was employed also in this case for measurement of the carrier distribution in this FET. Since the measurement of carrier distribution was possible for the gate-source voltage $V_{GS}$ range of 0 V (zero volt) through −3 V, it is clear that this FET functions in the normally-on mode (depletion mode).

Figure 19:
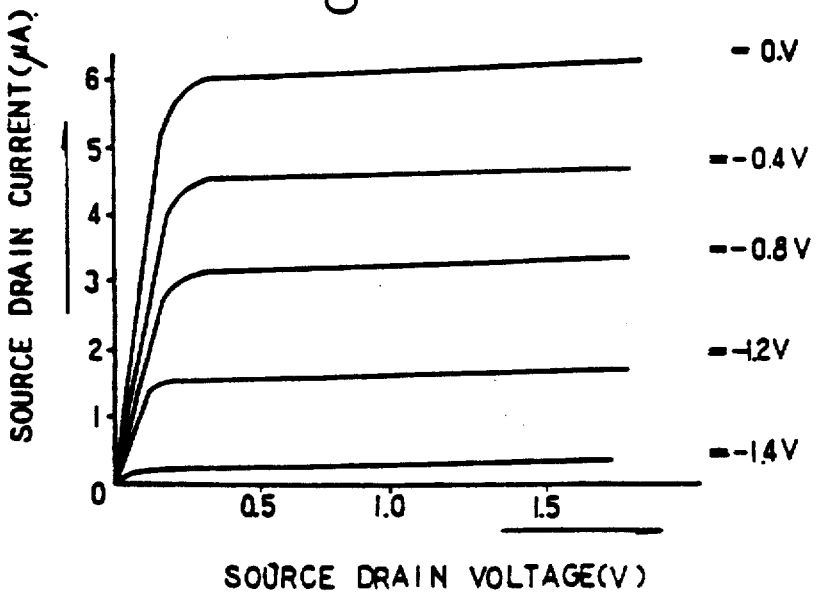
FIG. 19 shows a graph showing the source-drain current vs. the source-drain voltage characteristic determined employing the gate-source voltage as a parameter, of the FET whose layer configuration is shown in FIG. 17.

Further, the source-drain current vs. the source-drain voltage characteristic was measured for a FET with a gate length of 2 μm and a gate width of 150 μm employing the gate-source voltage as the parameter. FIG. 19 shows a result of the measurement which was carried out at 77° K. For comparison, a similar measurement was carried out also at 300° K. (not shown). The result was a considerable improvement (more than 4 times) of the characteristics at the lower temperature.

It is needless to refer to a possibility that charge compled devices can be produced in accordance with this embodiment.

It has become clear that in accordance with this embodiment, active semiconductor devices including a FET with high electron mobility particularly at cryogenic temperature are provided.

As is clear from the above description, this invention allows a wide variety of application. Firstly, pairs of channel regions and electron source regions are selected from pairs of materials having significant differences in electron affinity and also in energy gap from each other, and, which have similar crystal lattice indices, coefficients of expansion etc. Some examples of pairs of materials tabulated below:

| Pair | Material | Band gap eV | Crystal lattice index angstrom | Electron affinity eV |
|---|---|---|---|---|
| 1 | AlGaAs | 2.0 | 5.657 | 3.77 |
| | GaAs | 1.43 | 5.654 | 4.07 |
| 2 | AlGaAs | 2.0 | 5.657 | 3.77 |
| | Ge | 0.66 | 5.658 | 4.13 |
| 3 | GaAs | 1.43 | 5.654 | 4.07 |
| | Ge | 0.66 | 5.658 | 4.13 |

-continued

| Pair | Material | Band gap eV | Crystal lattice index angstrom | Electron affinity eV |
|---|---|---|---|---|
| 4 | CdTe | 1.44 | 6.477 | 4.28 |
| | InSb | 0.17 | 6.479 | 4.59 |
| 5 | GaSb | 0.68 | 6.095 | 4.06 |
| | InAs | 0.36 | 0.058 | 4.9 |

Secondly, the gate contact is allowed a wide variety, as described earlier. Namely, either the Schottky barrier gate type or the insulated gate type is acceptable. The essential requirement is confinement of electrons depleted from the layer configuration.

Thirdly, any type of non-conductive substrate is acceptable. Namely, either a semiconductor or an insulator is acceptable. The essential requirement is to form a single channel between [input and] *the source and drain* output terminals along a single heterojunction formed between a channel region of a material having a lesser electron affinity and an electron source region of a material having a larger electron affinity.

I claim:

1. An active semiconductor device with high electron mobility, comprising a source layer of a semiconductor doped with donor impurities, a channel layer of a semiconductor having a larger electron affinity than the semiconductor of the source layer and forming a heterojunction with said source layer, wherein a channel is formed in said channel layer along said heterojunction, at least one control terminal formed on [a selected one of] said source [and channel layers] *layer* over [said] *a* portion of said heterojunction, a pair of output terminals selectively formed on said source and channel layers, on opposite sides of said at least one control terminal, said source layer having sufficiently small thickness, at least under said at least one control terminal, so as to be entirely depleted of majority carriers under said at least one control electrode, wherein said output terminals are electrically connected, at least under said at least one control terminal, only by an accumulation of electrons with high mobility in said channel in said channel layer, depending on a control voltage applied to said control terminal.

2. The device of claim 1, said *at least one* control terminal being formed on said source layer, and said source layer having a thickness, under said at least one control terminal, such that said device is of the normally ON type.

3. The device of claim 1, said *at least one* control [electrode] *terminal* being formed on said source layer, and said source layer having a thickness, under said at least one control terminal, such that said device is of the normally OFF type.

4. The device of claim 3, the difference between said electron affinities of said source and channel layers being less than approximately the height of the potential barrier that would form at the bottom of the conduction band in said source layer at the boundary of said at least one [the] control [electrode] *terminal*, if said source layer were sufficiently thick to have a flat portion in its conduction band.

5. The device of claim 1, wherein said at least one control terminal is formed on said source layer and said source layer has a thickness, under said at least one control terminal, equal to or less than approximately $$\left(\frac{2\epsilon_S}{qN_D}\right)^{\frac{1}{2}}\left[\left(V_{D1}-\frac{kT}{q}\right)^{\frac{1}{2}}+\left(V_{D2}-\frac{kT}{q}\right)^{\frac{1}{2}}\right]$$

wherein $\epsilon_S$ is the dielectric constant of said source layer, $N_D$ is the concentration of said donor impurities in said source layer, $V_{D1}$ is the height of the potential barrier that would form in said source layer at the boundary of said at least one control terminal, if said source layer was sufficiently thick to have a flat portion in its conduction band.

$V_{D2}$ is the height of the potential barrier that would form in the conduction band in said source layer adjacent said channel layer, if said source layer was sufficiently thick to have said flat portion, and k is Boltzmann's constant, q is the electron charge, and T is absolute temperature.

6. The device of claim 5, said source layer being thicker, under said at least one control [electrode] *terminal*, than approximately the first term in the formula of claim 5.

7. The device of claim 5, said source layer having a thickness, under said at least one control terminal, that is equal to or less than approximately the first term in the formula of claim 5.

8. The device of claim 7, wherein $V_{D1}>V_{D2}$.

9. The device of claim 7, wherein $VD_1<V_{D2}$.

[10. The device of claim 1, wherein said at least one control terminal is formed on said channel layer, and said source layer has a thickness, under said at least one control terminal, that is equal to or less than]

$$\left[\left[\frac{2\epsilon_{SA}}{qN_D}\left(V_D-\frac{kT}{q}\right)\right]^{\frac{1}{2}}\right]$$

[wherein $\epsilon_{SA}$ is the dielectric constant of said source layer, $N_D$ is the concentration of said donor impurities in said source layer, $V_D$ is the height of the potential barrier that would form in the conduction band of the source layer adjacent said channel layer, if the source layer was sufficiently thick that the bottom of its conduction band had a flat portion, and k is the Boltzmann constant, q is the electron charge, and T is the absolute temperature.]

[11. The device of claim 10, wherein the ratio of the thickness of said channel layer to the thickness of said source layer, under said at least one control terminal, is greater than approximately]

$$\left[\left(\frac{qV_S}{\Delta E_C-E_F-kT}\right)\frac{\epsilon_{SG}}{2\epsilon_{SA}}\right]$$

[wherein $V_S$ is the height of the potential barrier in the bottom of the conduction band in said channel layer adjacent said at least one control terminal and the Fermi level in said channel, $\Delta E_C$ is the difference in the electron affinities of the source and channel layers, $E_F$ is the energy difference between the Fermi level and the bottom of the conduction band in the channel layer along said heterojunction, and $\epsilon_{SG}$ is the dielectric constant of said channel layer.]

[12. The device of claim 10, wherein the ratio of the thickness of said channel layer to the thickness of said source layer, under said at least one control terminal, is equal to or less than approximately]

$$\left[\left(\frac{qV_S}{\Delta E_C-E_F-kT}\right)\frac{\epsilon_{SG}}{2\epsilon_{SA}}\right]$$

[wherein $V_S$ is the height of the potential barrier in the bottom of the conduction band in said channel layer adjacent said at least one control terminal and the Fermi level in said channel, $\Delta E_C$ is the difference in the electron affinities of the source and channel layers, $E_F$ is the energy difference between the Fermi level and the bottom of the conduction band in the channel layer along said heterojunction, and $\epsilon_{SG}$ is the dielectric constant of said channel layer.]

[13. The device of claim 12, said source and channel layers having thicknesses, under said at least one control terminal, such that said device is of the normally ON type.]

[14. The device of claim 12, said source and channel layers having thicknesses, at least under said at least one control terminal, such that said device is of the normally OFF type.]

15. The device of any one of claims [1-14] *1-9*, wherein the non-selected one of said semiconductor layers is grown on a substrate of a substantially non-conductive material.

[16. The device of claim 11, 12, 13 or 14 wherein said source layer is formed on a buffer layer of an undoped semiconductor, and said buffer layer is formed on a substrate of a substantially non-conductive material.]

17. The device of any one of claims [1-14] *1-9*, wherein said source and channel layers, and control and output electrodes, comprise a FET having a substantially linear transfer conductance and amplification characteristic as a result of said output electrodes being connected, under said at least one control electrode, only by said high mobility electrons in said channels.

*18. An active semiconductor device as recited in claim 1, wherein:*

*the source layer is formed of AlGaAs semiconductor material; and*

*the channel layer is formed of GaAs semiconductor material.*

*19. An active semiconductor device as recited in claim 1, wherein:*

*the source layer is formed of AlGaAs semiconductor material; and*

*the channel layer is formed of Ge semiconductor material.*

*20. An active semiconductor device as recited in claim 1, wherein:*

*the source layer is formed of GaAs semiconductor material; and* the channel layer is formed of Ge semiconductor material.

21. An active semiconductor device as recited in claim 1, wherein:

the source layer is formed of CdTe semiconductor material; and the channel layer is formed of InSb semiconductor material.

22. An active semiconductor device as recited in claim 1, wherein:

the source layer is formed of GaSb semiconductor material; and the channel layer is formed of InAs semiconductor material.

23. An active semiconductor device as recited in claim 1, wherein:

said source layer is formed of an n-doped semiconductor material.

24. An active semiconductor device as recited in claim 23, wherein:

said channel layer is selectively formed of an undoped or an unintentionally doped semiconductor material.

25. An active semiconductor device as recited in claim 23, wherein said channel layer is undoped.

26. An active semiconductor device as recited in claim 1, further comprising a substrate, said channel layer being formed on said substrate and said source layer being formed on said channel layer, in succession.

27. An active semiconductor device as recited in claim 26, wherein:

said substrate is formed of a semi-insulating material.

28. An active semiconductor device as recited in claim 2 or 6, wherein:

said source layer is limited in lateral extent, in a plane transverse to the thickness thereof, substantially to the corresponding lateral extent of said at least one control terminal; and said pair of output terminals is formed on said channel layer, on opposite sides of said source layer and said at least one control terminal formed thereon.

29. An active semiconductor device as recited in claim 2 or 6, wherein:

a single control terminal is formed on said source layer;

said source layer is limited in lateral extent, in a plane transverse to the thickness thereof, substantially to the corresponding lateral extent of said control terminal; and said pair of output terminals is formed on said channel layer, on opposite sides of said source layer and said control terminal formed thereon.

30. An active semiconductor device as recited in claim 3 or 7, wherein:

said source layer, in a plane transverse to the thickness thereof, is substantially coextensive with said channel layer; and said source layer, in a central portion thereof under said at least one control terminal has said thickness such that said device is of the normally OFF type and the remaining portions of said source layer have a greater thickness, thereby to define a recessed said central portion of said source layer; and said at least one control terminal is formed on said recessed central portion.

31. An active semiconductor device as recited in claim 30, wherein:

said pair of output terminals is formed on said source layer on said greater thickness portions thereof on opposite sides of said recessed central portion thereof and comprise respective, deeply doped regions of said greater thickness portions of said source layer and the corresponding underlying portions of said channel layer.

32. An active semiconductor device as recited in claim 3 or 7, wherein:

a single control terminal is formed on said source layer;

said source layer, in a plane transverse to the thickness thereof, is substantially coextensive with said channel layer; and said source layer, in a central portion thereof under said single control terminal, has said thickness such that said device is of the normally OFF type and the remaining portions of said source layer have a greater thickness, thereby to define a recessed, said central portion of said source layer on which said single control terminal is formed.

33. An active semiconductor device as recited in claim 32, wherein:

said pair of output terminals is formed on said source layer on said greater thickness portions thereof on opposite sides of said recessed central portion thereof and comprise respective, deeply doped regions of said greater thickness portions of said source layer and the corresponding underlying portions of said channel layer.

34. An active semiconductor device as recited in claim 1, said at least one control terminal being formed on said source layer, and said source layer having a thickness, under said at least one control terminal, so as to be entirely depleted of majority carriers under said at least one control terminal and to afford electron accumulation in said channel in the channel layer for functioning as a normally ON type device.

35. An active semiconductor device as recited in claim 1, a single said control terminal being formed on said source layer, and said source layer having a thickness, under said at least one control terminal, so as to be entirely depleted of majority carriers under said at least one control terminal and to afford electron accumulation in said channel in the channel layer for functioning as a normally ON type device.

36. An active semiconductor device as recited in claim 1, said source layer having a recess in a central portion thereof, on which said at least one control terminal is formed, defining a thickness in said central portion under said at least one control terminal which is entirely depleted of majority carriers and prevents the accumulation of electrons in said channel in said channel layer in the absence of a control voltage applied to said control terminal, so as to function as a normally OFF type device.

37. An active semiconductor device as recited in claim 1, said source layer having a recess in a central portion thereof on which a single said control terminal is formed, defining a thickness in said central portion under said at least one control terminal which is entirely depleted of majority carriers and prevents the accumulation of electrons in said channel in said channel layer in the absence of a control voltage applied to said control terminal, so as to function as a normally OFF type device.

38. An active semiconductor device as recited in claim 1, said source layer having a central portion of said sufficiently small thickness and remaining portions of greater than said sufficiently small thickness thereby to define a recessed said central portion, and said at least one control terminal being formed on said recessed central portion of said source layer.

*39. An active semiconductor device as recited in claim 38, said source layer being limited in lateral extent, in a direction transverse to the thickness thereof, to the spacing between said pair of output terminals; and*

*said output terminals being formed on said channel layer.*

*40. An active semiconductor device as recited in claim 38, said output terminals being formed on said source layer on opposite sides of said recessed central portion and said at least one control terminal formed thereon.*

*41. An active semiconductor device with high electron mobility, comprising:*

*a substrate;*

*a channel layer formed on said substrate;*

*a source layer of a semiconductor doped with donor impurities, formed on said channel layer;*

*said channel layer comprising a semiconductor having a larger electron affinity than the semiconductor of the source layer and forming a heterojunction with said source layer;*

*at least one control terminal formed on said source layer and over at least a portion of said heterojunction;*

*a pair of output terminals each, independently, conductivity connected to said heterojunction and respectively disposed on opposite sides of said at least one control terminal, said source layer having sufficiently small thickness, at least under said at least one control terminal, so as to be entirely depleted of majority carriers under said at least one control electrode; and*

*said output terminals being electrically connected, at least under said at least one control terminal, only by an accumulation of electrons with high mobility in a channel defined by said heterojunction, depending on a control voltage applied to said control terminal.*

*42. An active semiconductor device as recited in claim 41, said source layer having a central portion of said sufficiently small thickness and remaining portions of greater than said sufficiently small thickness thereby to define a recessed said central portion, and said at least one control terminal being formed on said recessed central portion of said source layer.*

*43. An active semiconductor device as recited in claim 41, said source layer being limited in lateral extent, in a direction transverse to the thickness thereof, to the spacing between said pair of output terminals; and*

*said output terminals being formed on said channel layer.*

*44. An active semiconductor device as recited in claim 41, said output terminals being formed on said source layer on opposite sides of said recessed central portion and said at least one control terminal formed thereon.*

*45. An active semiconductor device as recited in claim 41, 42, 43 or 44, said at least one control terminal being formed on said source layer, and said source layer having a thickness, under said at least one control terminal, so as to be entirely depleted of majority carriers under said at least one control terminal and to afford electron accumulation in said channel in the channel layer for functioning as a normally ON type device.*

*46. An active semiconductor device as recited in claim 41, 42, 43 or 44, said source layer having a recess in a central portion thereof, on which said at least one control terminal is formed, defining a thickness in said central portion under said at least one control terminal which is entirely depleted of majority carriers and prevents the accumulation of electrons in said channel in said channel layer in the absence of a control voltage applied to said control terminal, so as to function as a normally OFF type device.*

* * * * *

UNITED STATES PATENT AND TRADEMARK OFFICE

CERTIFICATE OF CORRECTION

PATENT NO. : Re. 33,584

DATED : May 7, 1991

INVENTOR(S) : Takashi MIMURA

It is certified that error appears in the above-identified patent and that said Letters Patent is hereby corrected as shown below:

On the title page[56] References Cited:

Change "4,471,360" to --4,471,366--;
Change "Phys. Lett., Apr. 4" to --Phys. Lett., Apr. 15--.

Col. 2, line 68, before "various" insert --in--.

Col. 5, line 53, before "thermal" insert --under--;
line 65, after "leaving" insert --a--.

Col. 7, line 48, after "discussed" insert --below--.

Col. 11, line 38, change "to" to --and--.

Col. 13, line 6, insert --or--.

Col. 14, line 59, change "4.5" to --4/5--.

Signed and Sealed this

Twenty-ninth Day of June, 1993

*Attest:*

Michael K. Kirk

MICHAEL K. KIRK

*Attesting Officer*

*Acting Commissioner of Patents and Trademarks*